United States Patent
Hwang

[11] Patent Number: 5,837,403
[45] Date of Patent: Nov. 17, 1998

[54] PHOTOMASK FOR REMOVING THE NOTCHING PHENOMENON

[75] Inventor: Joon Hwang, Kyoungkido, Rep. of Korea

[73] Assignee: Hyundai Electronics Industries Co., Ltd., Kyoungkido, Rep. of Korea

[21] Appl. No.: 832,348

[22] Filed: Apr. 2, 1997

[30] Foreign Application Priority Data

Jun. 25, 1996 [KR] Rep. of Korea ............... 1996-23656

[51] Int. Cl.$^6$ ........................................... G03F 9/00
[52] U.S. Cl. ................................................. 430/5
[58] Field of Search ............................. 430/5, 322, 323

[56] References Cited

U.S. PATENT DOCUMENTS

| | | | |
|---|---|---|---|
| 5,281,500 | 1/1994 | Cathey et al. | 430/5 |
| 5,487,962 | 1/1996 | Rolfson | 430/5 |
| 5,591,550 | 1/1997 | Choi et al. | 430/5 |
| 5,672,450 | 9/1997 | Rolfson | 430/5 |

*Primary Examiner*—S. Rosasco
*Attorney, Agent, or Firm*—Jacobson, Price, Holman & Stern, PLLC

[57] ABSTRACT

The present invention provides a photomask for removing the notching phenomenon, which occurs when a photoresist pattern is formed on a highly reflective under layer.

In accordance with the present invention, there is disclosed a photomask used in forming photoresist patterns in a semiconductor device, wherein said semiconductor device includes a inclined metal layer by a topology of underlayers, said photomask comprising: a transparent substrate; main patterns formed on said transparent substrate; and dummy patterns formed on said transparent substrate, wherein said dummy patterns positioned between main patterns and positioned in an area corresponding to said inclined metal layer, and wherein said dummy patterns have a predetermined width and interval so that said dummy patterns leave no corresponding photoresist pattern, whereby said dummy patterns remove a notching phenomenon by attenuating the light intensity from a light source.

5 Claims, 2 Drawing Sheets

PHOTOMASK FOR REMOVING THE NOTCHING PHENOMENON

BACKGROUND OF THE INVENTION

1. Field of the Invention

This invention relates to a photomask for forming photoresist patterns in a semiconductor device, and more particularly to a photomask for removing the notching phenomenon which is caused by the high reflectivity of the under layer.

2. Description of the Prior Art

Generally, when photoresist patterns are formed on a highly reflective layer, for example, a metal layer or a silicide layer, in the photolithography process, the notching phenomenon may occur on the photoresist patterns. Referring to FIG. 1, the notching phenomenon according to a conventional photomask will be described hereinafter.

In the conventional photolithography process, a photoresist layer 4 is formed on a metal layer 3 which is formed on a semiconductor substrate 1. As shown in FIG. 1, in case the under layer 2 beneath the metal layer 3 has inclined portions, the metal layer 3 also has inclined portions. The light reflected on the inclined portions of the metal layer 3 expose the region 6 of the photoresist layer 4 which should not be exposed by the light through the photomask. As a result, the final photoresist patterns have some distorted profiles.

Typically, in order to solve the problem of the above mentioned notching phenomenon, a dyed photoresist is used as the photoresist layer 4, or an anti-reflection coating film is formed on the metal layer 3. However, this conventional method using the dyed photoresist or the anti-reflective coating film results in more cost burden and a more complicated photolithography process.

SUMMARY OF THE INVENTION

Therefore, the present invention has been made in view of the above mentioned problem, and the object of the present invention is to provide a photomask for removing the notching phenomenon, which occurs when a photoresist pattern is formed on a highly reflective under layer.

In accordance with the present invention, there is disclosed a photomask used to form photoresist patterns in a semiconductor device, wherein said semiconductor device includes an inclined metal layer by a topology of underlayers, said photomask comprising: a transparent substrate; main patterns formed on said transparent substrate; and dummy patterns formed on said transparent substrate, wherein said dummy patterns positioned between the main patterns and positioned in some areas corresponding to said inclined metal layer, and wherein said dummy patterns have a predetermined width and interval so that said dummy patterns leave no corresponding photoresist pattern, whereby said dummy patterns remove a notching phenomenon by attenuating the light intensity from a light source.

BRIEF DESCRIPTION OF THE DRAWINGS

A further understanding of the nature and advantages of the present invention will become apparent by reference to the remaining portions of the specification and drawings.

DETAILED DESCRIPTION OF THE PREFERRED EMBODIMENT

A detailed description of an embodiment according to the present invention will be given below with reference to FIGS. 2 and 3.

Figure 1:
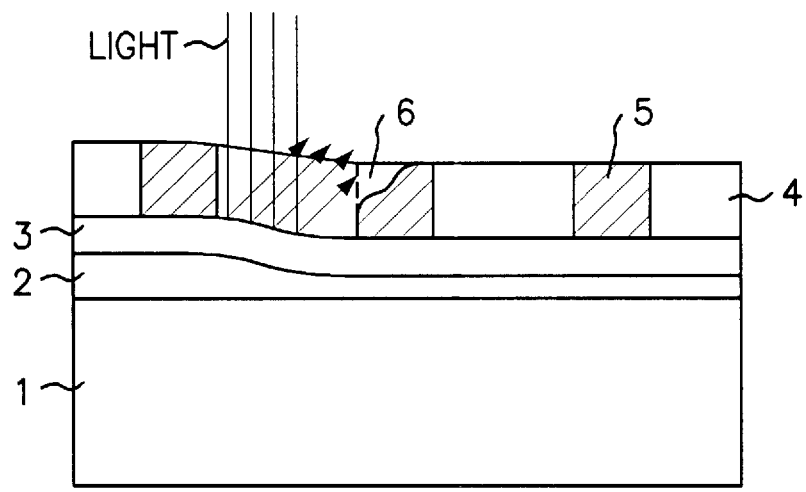
FIG. 1 is a schematic cross sectional view illustrating the effect of the notching phenomenon on the photoresist patterns which are formed on a highly reflective under layer according to the conventional photomask.
Figure 2:
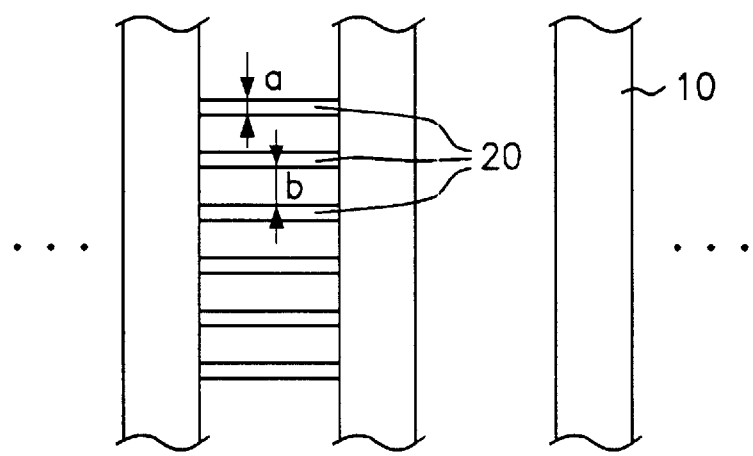
FIG. 2 is a top plane view illustrating a portion of a photomask according to the present invention.

First, referring to FIG. 2, in accordance with an embodiment of the present invention, a photomask has dummy patterns 20 formed between main patterns 10. The dummy patterns 20 will be aligned on some areas corresponding to some inclined portions of the metal layer, which has high reflectivity. The dummy patterns 20 of the photomask are formed as fine lines which are orthogonal to the main patterns 10. The width of a fine line, which is denoted as "a" in the FIG. 2, is preferably about 0.05 $\mu$m to 0.1 $\mu$m, and the interval between the fine lines, which is denoted as "b" in the FIG. 2, is preferably about 0.5 $\mu$m to 1.0 $\mu$m. With these widths and intervals, the dummy patterns 20 do not leave any corresponding photoresist pattern on the metal layer after the exposing and developing processes.

Figure 3:
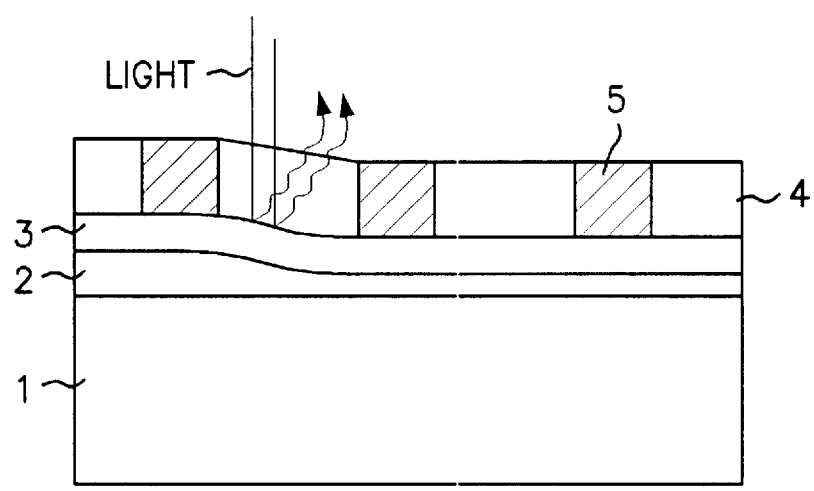
FIG. 3 is a schematic cross sectional view illustrating the profile of the photoresist patterns formed on the highly reflective layer by the photomask according to the present invention.

As shown in the FIG. 3, an under layer 2, which has some inclined portions, is formed on a semiconductor substrate 1. A metal layer 3, which has high reflectivity, formed on the under layer 2 also has inclined portions. Photoresist patterns 5 are formed on the metal layer 3 by exposing and developing the photoresist 4 with the photomask which has the dummy patterns 20 according to the present invention. The photoresist patterns 5 are not distorted because the dummy patterns 20 reduce the light intensity which passes through the photomask and prevent the undesired portions of the photoresist from being exposed.

As described above, according to the present invention, the dummy patterns 20, formed on the areas corresponding to the inclined portions of the metal layer 3, decrease the light intensity passing through the photomask. Therefore, the notching phenomenon is effectively removed.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

For example, although the above description of an embodiment of the present invention is provided with the presumption of the positive photoresist, the present invention can be also applicable to the negative photoresist by simply inversing the photomask pattern. Since the inversing procedure is well known to a person having ordinary skill in the art, a detailed description of it can be omitted.

What is claimed is:

1. A photomask used in forming photoresist patterns in a semiconductor device, wherein said semiconductor device includes a metal layer having an inclined portion by a topology of underlayers, said photomask comprising:

a transparent substrate;

main patterns formed on said transparent substrate, which are used in forming the photoresist patterns on said metal layer; and dummy patterns formed in said transparent substrate, wherein said dummy patterns are positioned on an area between the main patterns and corresponding to said inclined portion, and wherein said dummy patterns are determined to leave no corresponding photoresist pattern on said metal layer and to remove the notching phenomenon occurring on the photoresist pattern by decreasing the intensity of a light passing through the photomask.

2. A photomask according to claim 1, wherein said dummy patterns are orthogonal to said main patterns.

3. A photomask according to claim 1, wherein said dummy patterns are formed by using a plurality of fine lines orthogonal to said main patterns.

4. A photomask according to claim 3, wherein said fine line has a width of about 0.05 $\mu$m to 0.1 $\mu$m.

5. A photomask according to claim 3, wherein said fine lines are formed at an interval of about 0.5 $\mu$m to 0.1 $\mu$m.

* * * * *